United States Patent [19]
Klymyshyn et al.

[11] Patent Number: 6,111,477
[45] Date of Patent: *Aug. 29, 2000

[54] MICROWAVE PHASE SHIFTER INCLUDING A REFLECTIVE PHASE SHIFT STAGE AND A FREQUENCY MULTIPLICATION STAGE

[75] Inventors: David M. Klymyshyn; Surinder Kumar; Abbas Mohammadi, all of Saskatoon, Canada

[73] Assignee: Telecommunications Research Laboratories, Edmonton, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,970

[22] Filed: Apr. 17, 1997

[30] Foreign Application Priority Data

Apr. 11, 1997 [CA] Canada ................................. 2202457

[51] Int. Cl.[7] ............................. H01P 1/185; H03H 11/20

[52] U.S. Cl. .......................... 333/139; 333/164; 333/218

[58] Field of Search ................................. 333/164, 139, 333/218

[56] References Cited

U.S. PATENT DOCUMENTS

| | | | |
|---|---|---|---|
| 3,263,154 | 7/1966 | Steele | 333/218 X |
| 4,021,742 | 5/1977 | Machida . | |
| 4,028,641 | 6/1977 | Bodtmann et al. . | |
| 4,105,959 | 8/1978 | Stachejko | 333/164 |
| 4,288,763 | 9/1981 | Hopfer | 333/164 |

(List continued on next page.)

OTHER PUBLICATIONS

Chu A. et al; "Monolithic Analog Phase Shifter & Frequency Multipliers for mm–wave Phased Array Applications"; *Microwave Journal*; Dec. 1986; pp. 105–117.

Stepan and Robertson. "Analog Reflection Topology Building Blocks for Adaptive Microwave Signal Processing Applications", *IEEE Transactions on Microwave Theory and Techniques*, vol. 43, No. 3, Mar. 1995, P. 601–611.

Garver, Robert V. "360° Varactor Linear Phase Modulator", *IEEE Transactions on Microwave Theory and Techniques*, vol. MTT–17, No. 3, Mar. 1969, P. 137–157.

Ali and Mysoor. "An Analog MMIC Phase Modulator for X–Band Satellite Transponder Applications", *IEEE Microwave and Guided Wave Letters*, vol. 2, No. 11, Nov. 1992, p. 445–446.

Lucyszyn, Robertson, and Aghvami. "24 GHz Serrodyn Frequency Translator Using a 360° Analog CPW MMIC Phase Shifter", *Microwave and Guided Wave Letters*, vol. 4, No. 3, Mar. 1994, p. 71–73.

Linear reflection phase shifter with optimised varactor gamma, D.M. Klymyshyn, S. Kumar and A. Mohammadi, Electronics Letters, Jun. 5th, 1997, vol. 33, No. 12, p. 1054–1055.

A 360° Linear Microwave Phase Shifter with a FET Frequency/Phase Multiplier, David M. Klymyshyn, Surinder Kumar and Abbas Mohammadi, Microwave Journal, Jul. 1997, vol. 40, N. 7, P. 130–137.

*The Art of Electronics*, Second Edition, Paul Horowitz and Winfield Hill, Chapter 13, "High Frequency and High–Speed Techniques", Cambridge University Press, 1989, p. 897–901.

*Primary Examiner*—Benny Lee
*Attorney, Agent, or Firm*—Ken J. Pedersen; Barbara S. Pedersen

[57] ABSTRACT

A phase shifter/modulator which provides linear phase control of a microwave continuous wave carrier signal. Linear phase shift range in excess of 360 degrees is provided as a result of linear variation in control voltage. A reference signal, at a subharmonic of the output carrier signal frequency, is injected into a highly linear fractional range reflection type phase shifter. This fractional phase modulated signal is input to a field effect transistor (FET) based frequency/phase multiplier. The frequency/phase multiplier translates the subharmonic reference signal to the desired output carrier frequency with the full 360 degree phase shift range imposed on the output carrier signal.

16 Claims, 3 Drawing Sheets

U.S. PATENT DOCUMENTS

| | | | |
|---|---|---|---|
| 4,331,942 | 5/1982 | Matsunaga et al. | 333/161 |
| 4,458,219 | 7/1984 | Vorhaus | 333/164 |
| 4,539,535 | 9/1985 | Miller et al. | 333/164 |
| 4,568,893 | 2/1986 | Sharma | 333/157 |
| 4,638,269 | 1/1987 | Dawson et al. | 333/164 |
| 4,647,789 | 3/1987 | Upadhyayula | 333/104 X |
| 4,734,591 | 3/1988 | Ichitsubo | 333/218 X |
| 4,739,288 | 4/1988 | Ide et al. | |
| 4,788,509 | 11/1988 | Bahl et al. | 330/54 |
| 4,837,532 | 6/1989 | Lang | 333/164 |
| 4,859,972 | 8/1989 | Franke et al. | 333/164 |
| 4,897,618 | 1/1990 | Svetanoff | 331/76 |
| 5,119,050 | 6/1992 | Upshur et al. | 333/164 |
| 5,309,124 | 5/1994 | Cazaux et al. | 333/139 |
| 5,337,027 | 8/1994 | Namordi et al. | 333/161 |

6,111,477

MICROWAVE PHASE SHIFTER INCLUDING A REFLECTIVE PHASE SHIFT STAGE AND A FREQUENCY MULTIPLICATION STAGE

FIELD OF THE INVENTION

This invention relates to phase shifters, particularly for use in microwave circuit applications.

BACKGROUND OF THE INVENTION

This invention finds use in a number of microwave circuit applications which require full 360 degree linear phase control of a carrier signal. Examples of such applications include continuous phase modulation (CPM) and indirect frequency modulation (FM) radio communication transmitters, phase synchronisation of antenna and oscillator arrays, and phased array antenna beam steering.

Most microwave linear phase shifters are based on a single stage reflection topology using a circulator or coupler with appropriate reflective terminations. Large range phase shifters at these frequencies have been designed with some success as a cascade of smaller range single stage shifters. Another method of obtaining large range linear phase shift at microwave frequency is by detuning the tank circuit of an injection locked oscillator.

The problem with these traditional implementation strategies is that the circuitry required to implement the full 360 degree phase shift range becomes quite complicated. At microwave frequencies, this complicated circuitry can become quite inhibitive and can reduce the performance significantly on implementation. Also, phase shift linearity has to be sacrificed in order to maintain acceptable bandwidth. As a result of poor phase shift linearity over the full 360 degree range, complicated predistortion circuitry is required on the phase control signal to realize acceptable phase shift linearity.

SUMMARY OF THE INVENTION

This invention presents an alter native approach to realizing full 360 degree microwave linear phase shifters. A subharmonic reference signal, at 1/N times the carrier frequency, is injected into a highly linear fractional range (360 /N degree) reflection type varactor phase shifter. This fractional CPM carrier is then fed to a field effect transistor (FET) based linear frequency/phase multiplier (xN). The frequency/phase multiplier translates the subharmonic reference frequency to the desired carrier frequency and restores the full 360 degree phase shift range. The benefits of this new implementation include:

a. Simplified, cost effective hardware architecture, requiring only a single stage reflection type phase shifter.

b. Use of a subharmonic reference signal, which is easier to obtain than the higher frequency carrier signal.

c. Implementation of the linear reflection phase shifter at a subharmonic of the carrier frequency, resulting in realistic varactor values for the reactive terminations and higher phase shift linearity.

d. An effective xN increase in output bandwidth from the frequency/phase multiplier, when compared with a phase shifter designed at the carrier frequency.

There is therefore provided in accordance with one aspect of the invention, a phase shifting device comprising a voltage controlled phase shifter having an input port for injection of a first signal having a first frequency and a first frequency multiplier operatively connected to the voltage controlled phase shifter for receiving the first signal from the voltage controlled phase shifter and for translating the first signal to a second signal having a second frequency, the second frequency being higher than the first frequency.

In a further aspect of the invention, there is provided a method of phase shifting a signal comprising the steps of phase shifting a first signal at a first frequency and translating the first frequency to a second frequency, higher than the first frequency.

In further aspects of the invention the phase shifter preferably operates at microwave frequencies, the multiplier is formed with a field effect transistor, the multiplier has an integral multiplication factor; the voltage controlled phase shifter comprises a quadrature coupler having a pair of reflection ports and each of the reflection ports is terminated by equal reactive terminations; the reactive terminations comprise reverse biased varactor diodes, preferably abrupt or hyperabrupt varactor diodes with grounded series inductors; to achieve higher multiplication factors, a second frequency multiplier may be operatively connected to the first frequency multiplier for receiving the second signal and for translating the second signal to a third signal having a third frequency, the third frequency being higher than the second frequency, the third signal preferably being a multiple of the second frequency.

In a still further aspect of the invention, the first frequency is translated in a FET, having a gate bias, the first signal has a signal level, and the gate bias and subharmonic input signal level are selected such that the FET has unconditional stability at all subharmonics of the second signal.

These and other aspects of the invention are described in the detailed description of the invention and claimed in the claims that follow.

BRIEF DESCRIPTION OF THE DRAWINGS

There will now be described preferred embodiments of the invention, with reference to the drawings, by way of illustration only and not with the intention of limiting the scope of the invention, in which like numerals denote like elements and in which.

DETAILED DESCRIPTION OF PREFERRED EMBODIMENTS

The present invention is a novel device for achieving full 360 degree linear phase control of a microwave carrier signal or other microwave signal. In this patent document, the team "microwave" is taken to mean the range of frequencies from 1–100 GHz although it will be appreciated that the utility of the invention in higher frequencies is only limited by the present availability of components, and not by the principle of operation of the invention.

Figure 1:
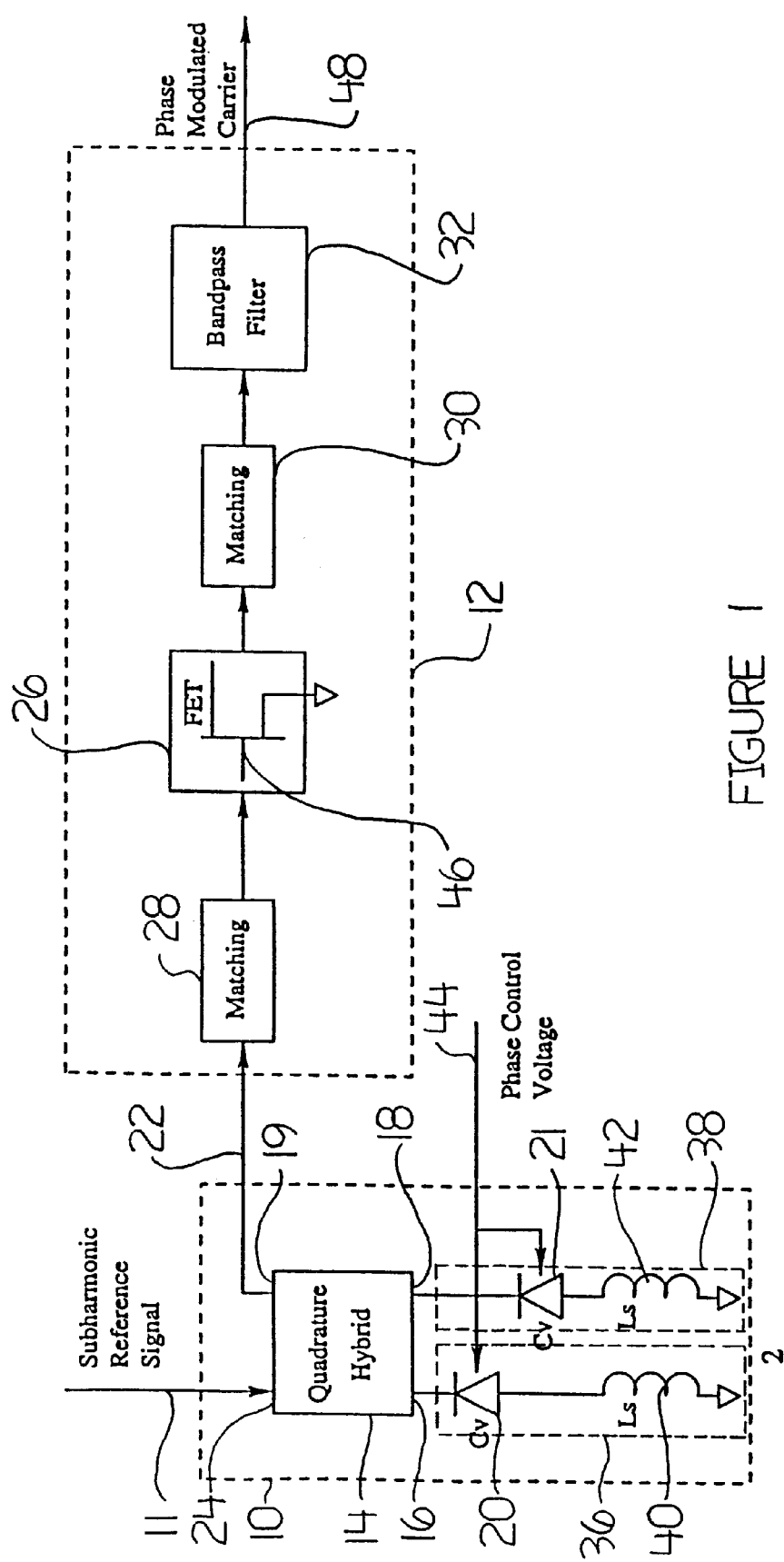
FIG. 1 is a functional block diagram of the 360 degree linear phase shifter.
Figure 2:
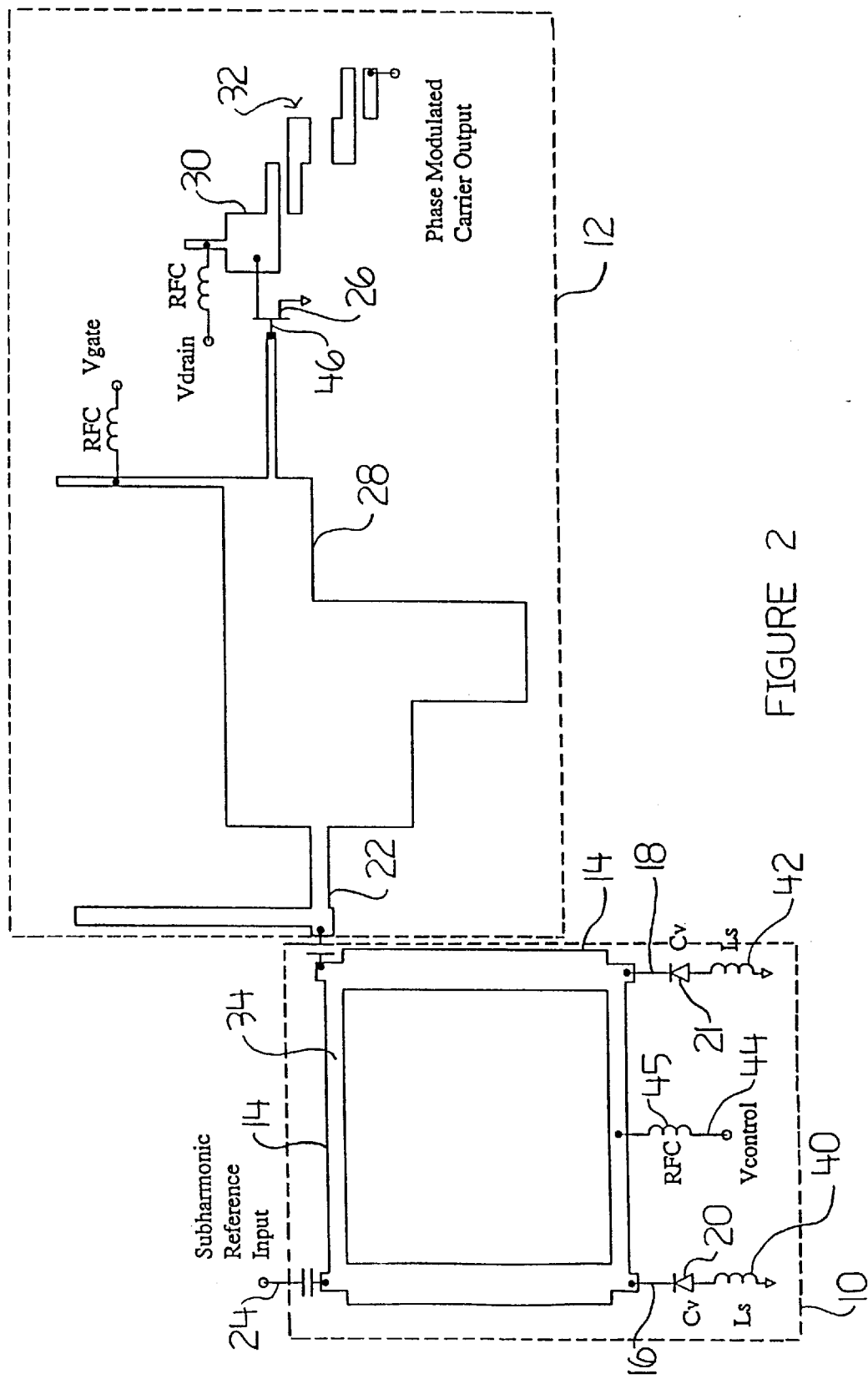
FIG. 2 is a microstrip schematic for a 360 degree linear phase shifter.

The functional block diagram of the 360 degree linear phase shifter is shown in FIG. 1. FIG. 2 presents a microstrip schematic for a 360 degree linear phase shifter implementation example at 18 GHz, using gallium arsenide (GaAs) hyperabrupt junction varactors and a single GaAs FET. Very few components are required to implement this invention at microwave frequencies, which makes it attractive for many applications.

The phase shifting device in on embodiment shown in FIG. 1 of the invention has two main functional elements.

The first is a voltage controlled phase shifter 10 to which is operatively connected the second element which is a frequency multiplier 12 for receiving phase shifted signals from the voltage controlled phase shifter 10 and translating the phase shifted signals to a higher frequency, thus expanding the effective phase shift.

Figure 3:
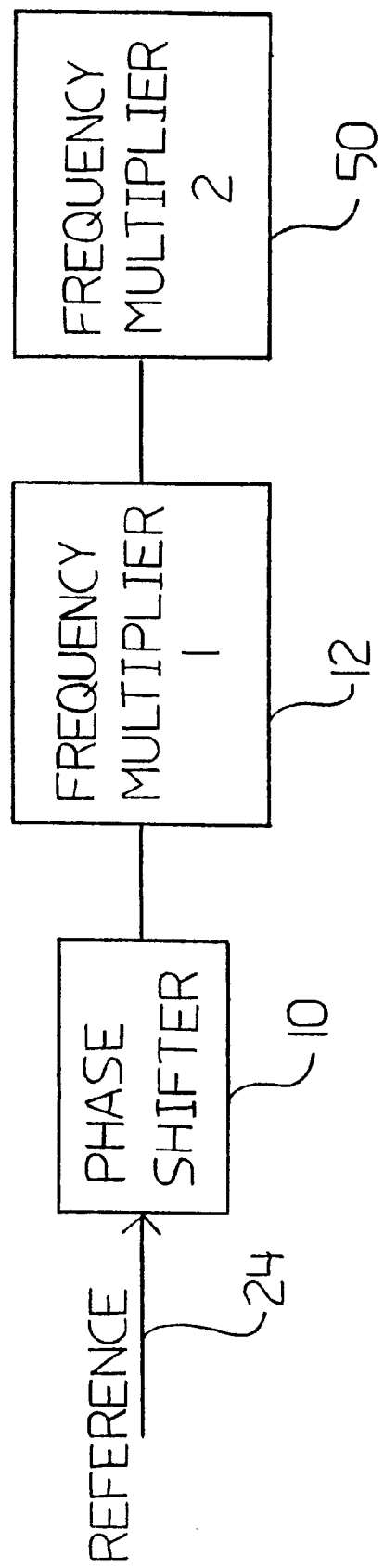
FIG. 3 is a functional block diagram showing an implementation of the invention with multiple multiplier stages.

Referring to the FIG. 1 and FIG. 3 a subharmonic reference signal from source 11, at ⅕ of the carrier frequency or 3.6 GHz for the sample implementation, is injected into the voltage controlled phase shifter 10 at −12 dBm. The phase shifter 10 is preferably a linear fractional range reflection type varactor phase shifter. The phase shifter 10 is comprised of a microstrip quadrature hybrid coupler 14, with a direct port 16 and coupled port 18 terminated in the same variable capacitance series inductance, inductor/capacitor (LC), reactive terminations 36, 38. The quadrature hybrid 14 is not especially wideband, but is simple, and provides adequate bandwith for the sample implementation. Other wideband couplers or circulators could also be used. The variable capacitance characteristic is provided via reverse biased varactor diodes 20, 21. With ideal reactive terminations, all power is reflected from the direct and coupled ports 16, 18 and combines constructively at the isolated port 19 of the coupler 14 with no loss. In practice, some loss occurs from parasitic resistance in the terminations. The phase shift through the hybrid coupler 14 is a function of the termination reactance, and thus, can be controlled by varying the bias voltage on the varactors 20, 21 and changing the series capacitance.

The reference signal enters the input port 24 of the microstrip quadrature hybrid coupler 14 and is reflected to the isolated output port 19 of the coupler 14 by equivalent reactive terminations 36, 38 on the direct and coupled ports 16, 18 of the coupler 14. The reactive terminations are comprised of grounded series inductors 40, 42 and series reverse biased varactor diodes 20, 21. The varactor diodes 20, 21 provide a variable capacitance characteristic by varying the reverse biased diode control voltage supplied at line 44 through inductor 45 (FIG. 2). The total series inductance includes the parasitic series inductance of the varactor diodes 20, 21 and ground connections.

The varactor capacitance versus voltage (CV) relationship that provides linear phase shift through the hybrid 14 is not linear. Obtaining linear phase shift from a reflective termination requires that the termination reactance be matched to the tangent function of the linear varactor bias voltage variation. An abrupt junction varactor, with gamma ($\gamma$) of 0.5, is generally suitable for matching to the tangent function, over a limited bias voltage range. With a subharmonic reference signal in the range of 3 to 5 GHz, the required minimum varactor capacitance becomes comparable to the varactor parasitic package capacitance. The result of this is a flattening of the CV characteristic and the termination reactance characteristic as a function of increasing bias voltage. With this situation, the abrupt junction varactor, with $\gamma=0.5$, no longer provides a good match to the tangent function, resulting in poor phase shift linearity. Using an available hyperabrupt junction varactor for the diodes 20, 21, with $\gamma=0.75$, a near optimal match to the tangent function is obtained over a limited phase shift range, when a suitable series inductor 40, 42 is used, for a subharmonic reference signal of 3.6 GHz.

The fractional CPM signal at the output 22 of the reflection phase shifter 10 is fed to a field effect transistor (FET) frequency/phase multiplier 12. The frequency/phase multiplier 12 translates the modulated subharmonic reference signal to the desired carrier frequency and restores the full 360 degree phase shift range. The multiplier 12 consists of a GaAs FET 26, input and output matching circuitry 28, 30, output harmonic termination circuitry 32, and biasing circuitry (not shown, but various Implementations may be used as is known to a skilled person in the art). The FET 26 is biased strongly Class C to obtain a conduction angle at the gate that maximizes the 5th harmonic. Input and output matching circuitry 28, 30 should be designed to provide simultaneous conjugate match at 3.6 GHz on the input and 18 GHz on the output. A simple coupled line bandpass filter (BPF) 32 is provided on the output to reject all unwanted spurious harmonic signals. More complicated harmonic termination circuitry on the FET input and output could also be used but was unnecessary for the sample implementation.

The input matching circuitry 28 is preferably implemented using microstrip as shown in FIG. 2, and is provided to conjugately match the phase shifter output impedance to the low input gate impedance of the FET 26 at the subharmonic reference frequency. The input impedance of the FET 26 is essentially reactive, which makes wideband input matching very difficult. The effect of mismatch at the FET gate 46 is a variation in gate signal level. This, together with non-constant phase shifter output impedance as a function of control voltage causes a variation in the FET conduction angle. The harmonic output level in high harmonic FET multipliers is fairly sensitive to conduction angle, so significant amplitude modulution (AM) can be a result in the output CPM signal if this input matching is poor. This effect is offset by the increase in effective output bandwidth by a factor of xN as a result of frequency multiplication, so a narrowband subharmonic gate match is generally acceptable.

The multiplication factor for the sample implementation is x5. If multiplication factors greater than x7 are required, an additional frequency multiplier 50, constructed as the multiplier 12 with a Class C biased FET stage 26, along with interstage matching and harmonic termination circuitry, can be added as shown in FIG. 3. The gate 46 of the FET 26 is biased for a realistic conduction angle that maximizes the harmonic output level (about 140 degrees). The gate bias and the FET input signal level should be carefully selected according to known techniques to provide unconditional stability at all subharmonics of the output carrier frequency. If the combination of gate bias and input signal amplitude pulls the peak gate voltage too far below the gate threshold voltage, the transistor becomes conditionally stable at subharmonic frequencies of the output, and is very difficult to terminate. The input and output microstrip matching networks 28 and 30 should be designed to provide simultaneous conjugate matching to the FET at 3.6 GHz on the input and 18 GHz on the output in the exemplary implementation. A 2nd order coupled line bandpass filter (BPF) 32 is used on the output of the matching network 30 to select the desired CPM carrier signal and reject all unwanted spurious harmonic signals. The filter rejection is adequate to maintain all spurious harmonic output signals at below −30 dBc. The CPM carrier signal 48 with 360 degree linear phase modulation range is output from the FET multiplier 12 at a level of approximately −30 dBm.

Using this novel hardware architecture, a sample circuit was designed at 18 GHz using microstrip as is shown for example at 34 in FIG. 2 for a sample 360 degree linear phase shifter implementation at 18 GHz on a 25 mil thick Alumina substrate (not shown) with $\epsilon r=9.8$ and metal thickness of 0.15 mil. Hyperabrupt, GaAs chip varactors 20, 21, with $\gamma=0.75$, $C_{max}=2.4$ pF, and parasitic package capacitance of $C_p=0.15$ pF, were used in the fractional phase shifter reactive terminations 36, 38 along with 3.5 nH of series inductance. A general purpose medium power GaAs FET 26 was used in the frequency/phase multiplier section.

The circuit provided a total phase shift range of 425 degrees, for a varactor reverse bias voltage range of 1.3 to 11.8 V. Residual amplitude modulation (AM) is within 0.15 dB over the same bias range. A linear phase shift range of 370 degrees at 18 GHz was obtained within ±1 degree, for a varactor reverse bias volt age range of 1.4 to 10.5 V. The output bandwidth at 18 GHz is 200 MHz, with amplitude and phase distortion within 0.5 dB and 5 degrees, respectively, across the band. All output harmonic spurious signals are below −30 dBc, and the circuit conversion loss is approximately 18 dB.

While a preferred implementation has been described, the invention is not limited to the exemplary features described. A person skilled in the art will appreciate that immaterial variations are intended to be encompassed within the scope of the invention.

The embodiments of the invention in which an exclusive property or privilege is claimed are defined as follows:

1. A phase shifting device, comprising:

a voltage controlled phase shifter having a first input port for injection of a first signal having a first frequency and a second input port for injection of a control voltage, the voltage controlled phase shifter having an output port for outputting a modulated signal whose phase is controlled by the control voltage over a first linear phase modulation range; and a first frequency multiplier operatively connected to the voltage controlled phase shifter for receiving the modulated signal from the output port of the voltage controlled phase shifter and for translating the modulated signal to a second signal having a second frequency, the second frequency being higher than the first frequency, the second signal having a full 360° phase modulation range.

2. The phase shifting device of claim 1 in which:

the first frequency multiplier has an integral multiplication factor N; and the first modulation range is at least 360°/N.

3. The phase shifting device of claim 2 further comprising a second frequency multiplier operatively connected to the first frequency multiplier for receiving the second signal and for translating the second signal to a third signal having a third frequency, the third frequency being higher than the second frequency.

4. The phase shifting device of claim 3 in which the third frequency is a harmonic of the second frequency.

5. The phase shifting device of claim 2 in which the voltage controlled phase shifter comprises:

a quadrature coupler having a pair of reflection ports; and each of the reflection ports being respectively terminated by equal reactive terminations.

6. The phase shifting device of claim 5 in which each one of the reactive terminations comprise respective reverse biased varactor diodes.

7. The phase shifting device of claim 5 in which each reactive termination comprises a respective grounded series combination of a corresponding abrupt junction varactor and an inductor.

8. The phase shifting device of claim 5 in which each reactive termination comprises a respective grounded series combination of a corresponding hyperabrupt junction varactor and an inductor.

9. A method of phase shifting a signal the method comprising the steps of:

phase shifting a first signal at a first frequency by modulation with a voltage control signal over a range of a full 360°/N where N is an integer greater than 1; and frequency multiplying the first signal by a factor of N to produce a second signal having a second frequency, higher than the first frequency, and thus expanding the effective phase shift of the second signal by a factor of N.

10. The method of claim 9 in which the first frequency is translated in a FET, having a gate bias, the first signal has a subharmonic input signal level, and the gate bias and subharmonic input signal level are selected such that the FET has unconditional stability at all subharmonics of the second signal.

11. A 360 degree linear phase shifter, for continuous modulation of the phase of a carrier signal having a carrier frequency, comprising:

a linear phase shifter comprising a quadrature coupler having an input port, reflective terminations and an output port, the input port being connected to a source of a reference signal at a subharmonic frequency of the carrier frequency, the linear phase shifter being operable over a fraction of the full 360 degree range, the reflective terminations having a respective reactance controlled by a corresponding linear control signal; and a frequency multiplier operatively connected to the output port for translating the subharmonic reference frequency to the carrier frequency and restoring full 360 degree phase shift range.

12. The linear phase shifter of claim 11 in which the frequency multiplier is a multiple stage frequency multiplier.

13. The linear phase shifter of claim 11 in which the frequency multiplier comprises a field effect transistor.

14. The linear phase shifter of claim 11 in which each reactive termination comprises a respective grounded series combination of a corresponding hyperabrupt junction varactor and an inductor.

15. The linear phase shifter of claim 11 in which each reactive termination comprises a respective grounded series combination of a corresponding abrupt junction varactor and an inductor.

16. The linear phase shifter of claim 11 in which each one of the reflective terminations comprise respective reverse biased varactor diodes.

* * * * *